(12) United States Patent
Rosenthal et al.

(10) Patent No.: US 9,345,151 B2
(45) Date of Patent: May 17, 2016

(54) HOUSING AND CONSTRUCTION KIT FOR A CONTROL APPARATUS

(71) Applicant: Brose Fahrzeugteile GmbH & Co. Kommanditgesellschaft, Hallstadt, Hallstadt (DE)

(72) Inventors: Karl-Heinz Rosenthal, Baunach (DE); Sascha Keim, Grossheirath (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 94 days.

(21) Appl. No.: 14/352,045

(22) PCT Filed: Nov. 2, 2012

(86) PCT No.: PCT/EP2012/071730
§ 371 (c)(1),
(2) Date: Apr. 15, 2014

(87) PCT Pub. No.: WO2013/072202
PCT Pub. Date: May 23, 2013

(65) Prior Publication Data
US 2014/0240931 A1 Aug. 28, 2014

(30) Foreign Application Priority Data

Nov. 15, 2011 (DE) .......................... 10 2011 055 349

(51) Int. Cl.
*H05K 5/00* (2006.01)
*E05F 15/695* (2015.01)
(Continued)

(52) U.S. Cl.
CPC ............ *H05K 5/0052* (2013.01); *E05F 15/695* (2015.01); *E05F 15/697* (2015.01);
(Continued)

(58) Field of Classification Search
USPC .......................... 361/728–733, 752, 796, 800
See application file for complete search history.

(56) References Cited

U.S. PATENT DOCUMENTS 5,930,112 A * 7/1999 Babinski et al. .............. 361/695
6,317,332 B1 11/2001 Weber et al.
(Continued)

FOREIGN PATENT DOCUMENTS

DE 197 46 518 A1 4/1999
DE 198 51 455 A1 8/1999
(Continued)

OTHER PUBLICATIONS

Japanese Office action for Application No. 2014-541600, dated Jun. 9, 2015 and English translation (10 pages).
(Continued)

*Primary Examiner* — Hung S Bui
(74) *Attorney, Agent, or Firm* — Lewis Roca Rothgerber Christie LLP

(57) ABSTRACT

The present invention among other things relates to a housing and a construction kit for a control apparatus, e.g. in the form of a controller for a window lifter of a motor vehicle. A controller module with a printed circuit board here is to be accommodated in a housing at least in part, and there are provided two different types of controller modules, e.g. for a right vehicle side on the one hand and for a left vehicle side on the other hand. According to a first aspect of the invention the housing is suitable for both types of controller modules, so that the housing can selectively be combined with the one or the other type of controller module, in order to mount a control apparatus.

15 Claims, 15 Drawing Sheets

(51) Int. Cl.
*E05F 15/697* (2015.01)
*H02K 11/00* (2016.01)

(52) U.S. Cl.
CPC ............ *H02K11/0084* (2013.01); *H05K 5/006* (2013.01); *E05Y 2201/10* (2013.01); *E05Y 2800/174* (2013.01); *E05Y 2800/72* (2013.01); *E05Y 2900/55* (2013.01); *H02K 11/0021* (2013.01)

(56) References Cited

U.S. PATENT DOCUMENTS

2005/0013095 A1    1/2005  Oda
2015/0144392 A1*   5/2015  Sunaga et al. ............... 174/262

FOREIGN PATENT DOCUMENTS

| DE | 101 08 414 A1 | 9/2002 |
|---|---|---|
| DE | 101 41 246 C1 | 4/2003 |
| JP | 11-332061 A | 11/1999 |
| JP | 2005-39879 A | 2/2005 |
| WO | WO 2008/046832 A2 | 4/2008 |

OTHER PUBLICATIONS

International Search Report of corresponding PCT/EP2012/071730, dated Apr. 25, 2013, 4 pages.

English translation of the International Preliminary Report on Patentability and Written Opinion for International Application No. PCT/EP2012/071730, dated May 30, 2014, (7 sheets).

* cited by examiner

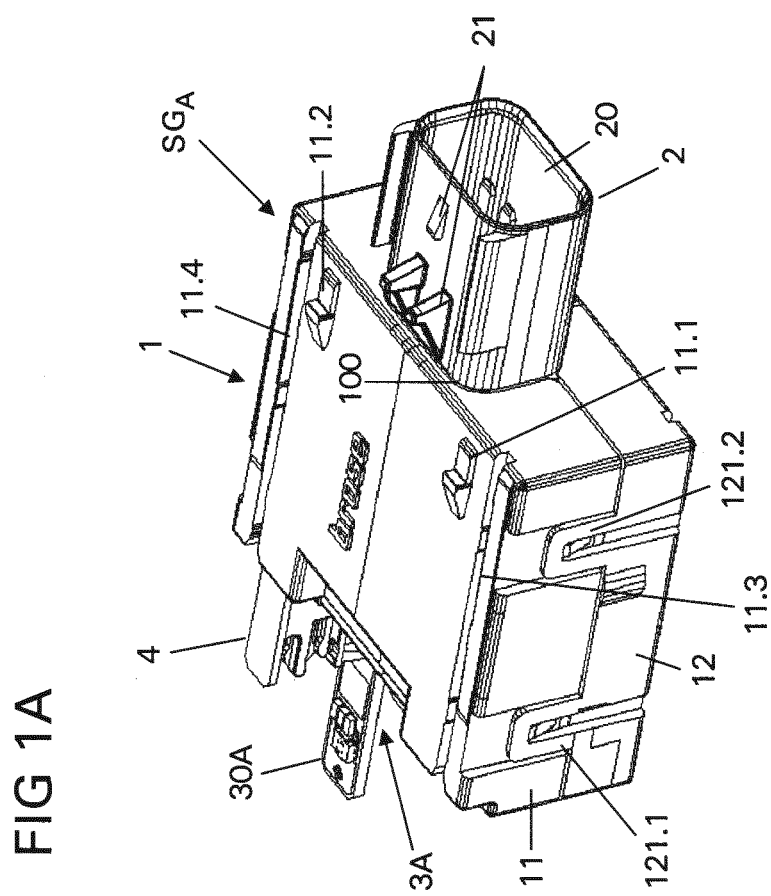

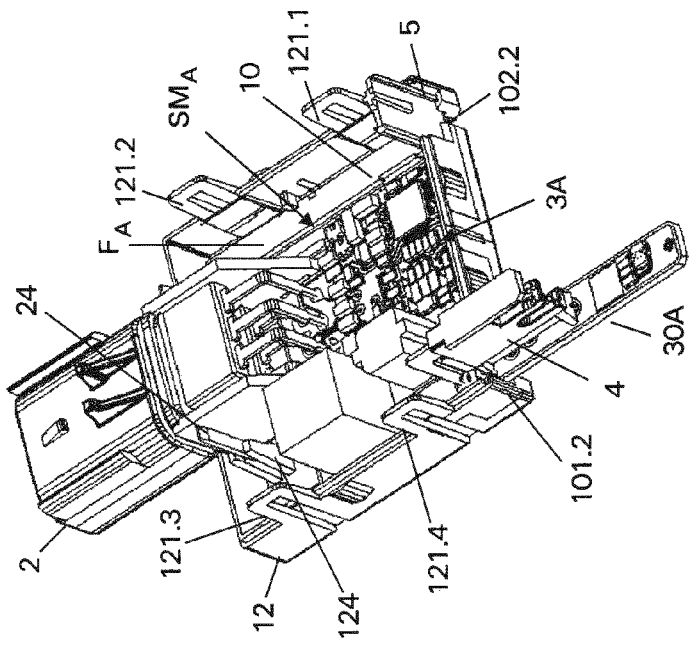
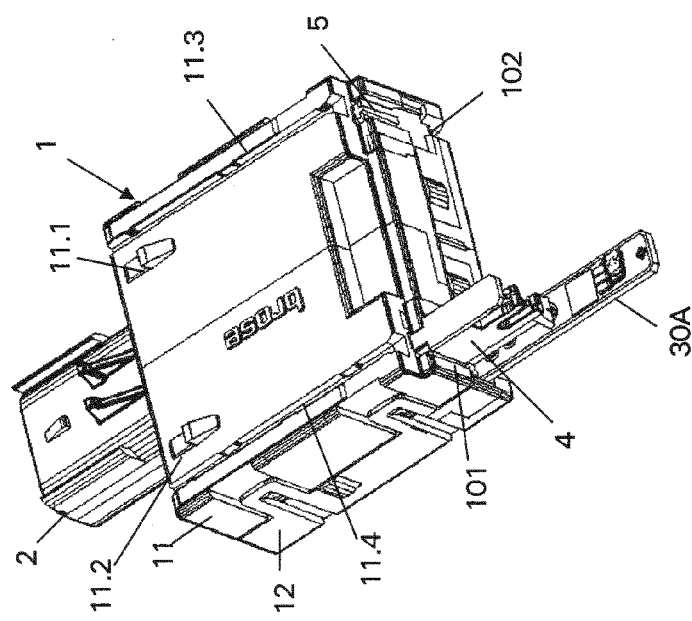

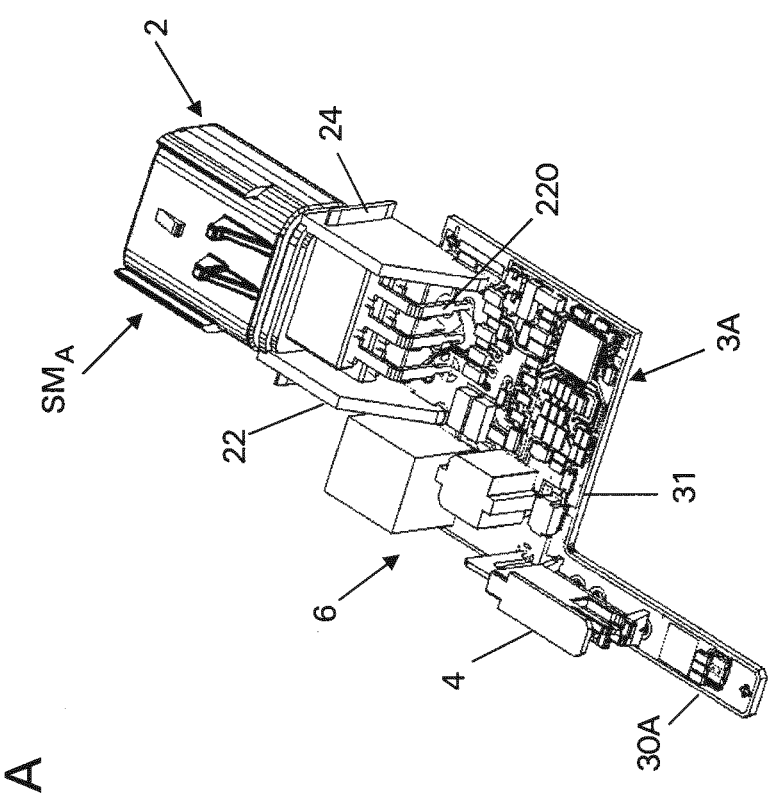

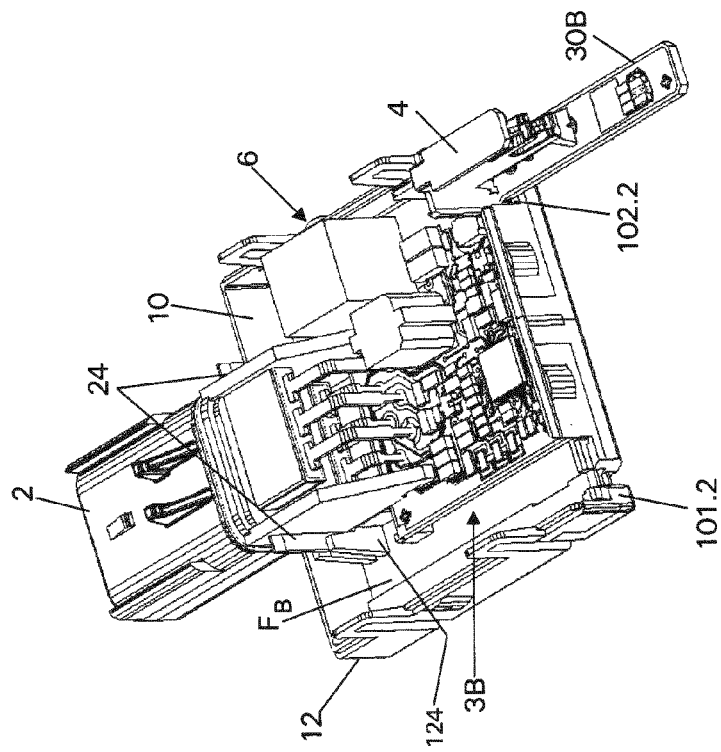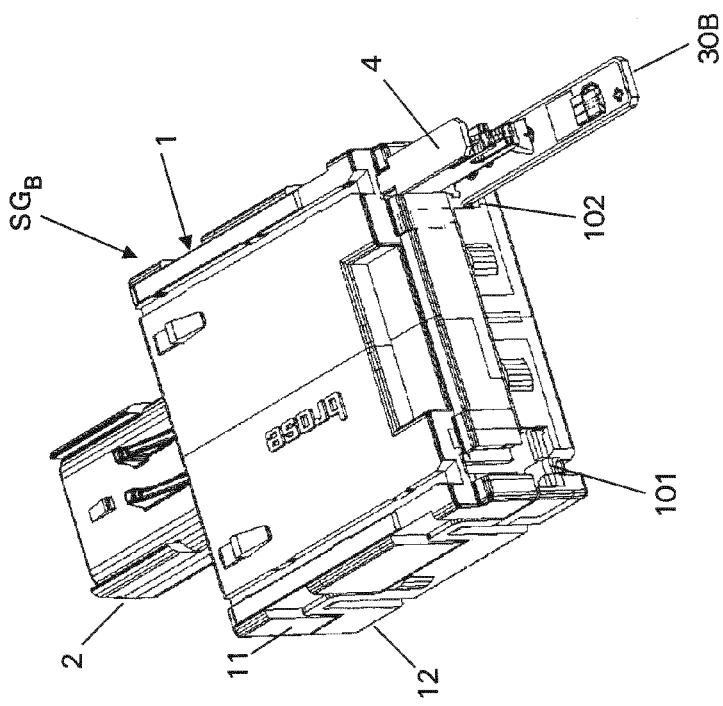

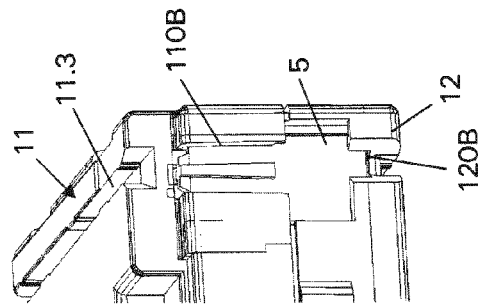
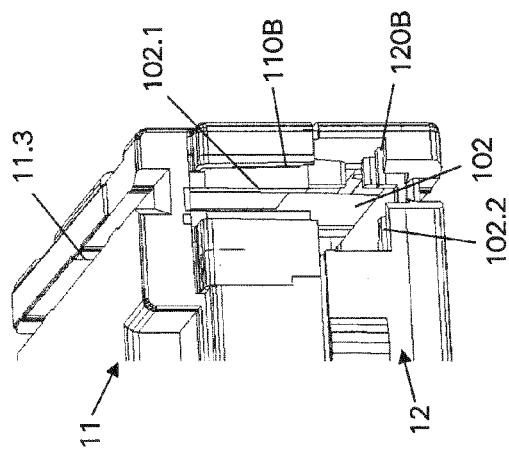
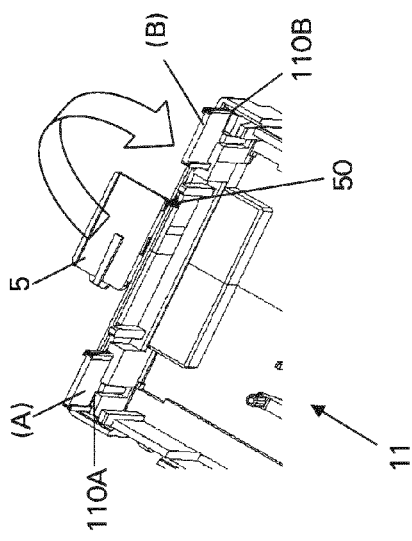

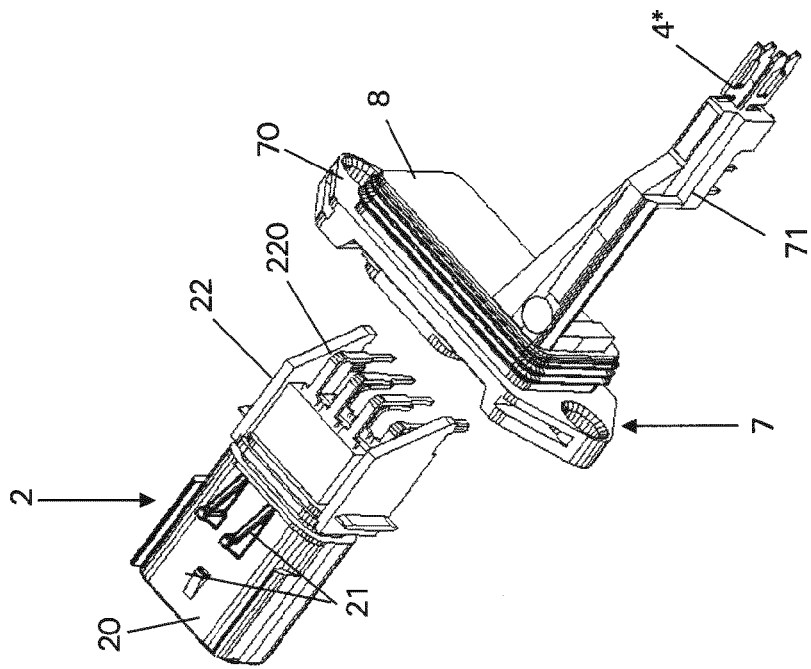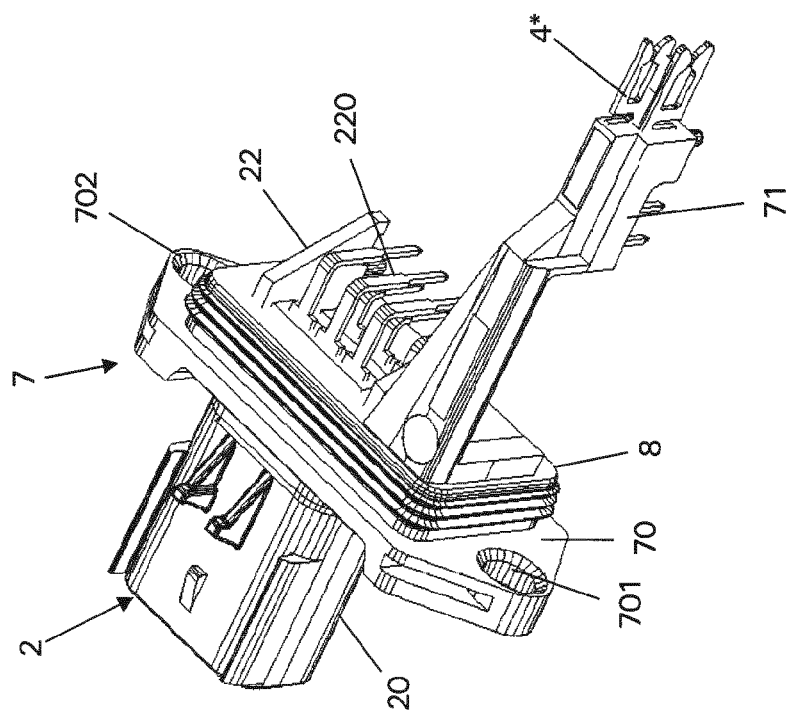

HOUSING AND CONSTRUCTION KIT FOR A CONTROL APPARATUS

CROSS-REFERENCE TO A RELATED APPLICATION

This application is a National Phase Patent Application of International Patent Application Number PCT/EP2012/071730, filed on Nov. 2, 2012, which claims priority of German Patent Application Number 10 2011 055 349.5, filed on Nov. 15, 2011.

BACKGROUND

The present invention among other things relates to a housing.

Such housing is formed and provided for an electronic controller module, wherein the controller module, as part of a control apparatus, serves for controlling a drive unit, in particular a motor vehicle adjusting device, such as e.g. a window lifter. The housing usually protectively accommodates at least one printed circuit board of the controller module in its interior.

Especially in the motor vehicle sector different controllers are provided, which differ from each other depending on the arrangement of the drive unit to be controlled inside the motor vehicle. In practice, different forms of printed circuit boards previously have been used in dependence on whether the control apparatus formed therewith is to be arranged in a wet or dry space or on the left vehicle side or the right vehicle side of the motor vehicle. Different types of controller modules, e.g. for the left vehicle side on the one hand and the right vehicle side on the other hand, regularly have different geometric shapes and dimensions in the printed circuit boards. Correspondingly, a multitude of different housings must be provided, which each are designed for one type of controller module.

Up to now, in particular a controller with its associated housing, which is formed and provided in the dry space of a left motor vehicle door for controlling a window lifter, is designed constructively different from a controller with associated housing which is formed and provided in the dry space of a right motor vehicle door for controlling a window lifter.

In addition, housings and printed circuit boards of a controller which is to be arranged in a wet space of a motor vehicle door currently differ from the controller and the printed circuit board of a controller which is to be arranged in a dry space of a motor vehicle door. In particular, this is due to the fact that in a controller to be arranged in a wet space the electronic components arranged on the printed circuit board can be protected from possibly penetrating moisture in a better way. Therefore, the printed circuit board usually must almost completely be accommodated at least in part in an interior of the housing sealed against the exterior space and thus in a housing which is formed constructively different from a housing for a dry space.

In particular, however, the different components for a control apparatus for controlling a drive unit, which all vary depending on the type and application of the control apparatus, involve a high logistic effort, since all the different components must be kept in stock. Furthermore, a plurality of tools provided for manufacturing the individual, different components must be provided, and the individual components also must be coordinated with great expenditure.

SUMMARY

Therefore, it is an object of the present invention to provide a possibility for manufacturing control apparatuses for controlling a drive unit, in particular a drive unit for a motor vehicle adjusting device with different equipment variants and for different mounting locations, as inexpensively and easily as possible.

The housing according to an exemplary embodiment of the invention is formed and provided to selectively at least partly accommodate at least the printed circuit board of one of at least two different types of controller modules with different printed circuit boards, wherein a first type of controller module is equipped and provided for controlling a drive unit on a first side of a motor vehicle and a second type of control module is equipped and provided for controlling a drive unit on a second side of the motor vehicle, which is located opposite the first side transversely to a longitudinal vehicle axis. In other words, there is provided a housing which selectively partly or completely accommodates the printed circuit board of a controller module in its interior, namely independent of whether the controller module is equipped and provided for a drive unit on a first (e.g. the left) vehicle side or on the opposite (the right) vehicle side.

The housing consequently includes e.g. an interior space dimensioned such that depending on the type of the chosen controller module either the one or the other printed circuit board of the respective controller module selectively can be mounted in the housing. Preferably, the housing includes portions, such as e.g. housing openings, which are provided either for accommodating the one printed circuit board or for accommodating the other printed circuit board. Accordingly, the housing is formed such that it satisfies both the specifications for the arrangement of a controller module of a first type and the specifications for a controller module of a second type. In this way, only one housing must be provided, in order to be able to mount a control apparatus for either the right or the left vehicle side by combination with a controller module either of the first or the second type.

A coupling of a controller module with the drive unit to be controlled advantageously is provided via a (motor) connector, which is connected with the printed circuit board and possibly even arranged on the same. The controller module at least partly accommodated in the housing thus can easily be connected with a corresponding port of a drive unit of the adjusting device. The connection of the controller module with a superordinate control system usually likewise is realized via a (further) connector to which for example a cable can be connected.

According to a further exemplary aspect of the invention, it is provided that a housing for an electronic controller module includes at least two housing openings in each of which a connector of a controller module can be held, and that the housing is formed and provided to selectively at least partly accommodate at least the printed circuit board and the at least one connector of one of at least two different types of controller modules such that the connector of a first type of controller module is held in the one housing opening and the connector of the second type of controller module is held in the other housing opening.

Hence, there is specified a housing which includes housing openings both for a connector of a controller module of a first type and for a connector of a controller module of a second type. Thus, such housing also can be employed for two different controller modules, in which motor connectors provided for connection to a drive unit to be controlled are arranged at different points of the housing, when the respective controller module with its associated printed circuit board is at least partly accommodated in the housing. An example for this are the controller modules already discussed above, which depending on whether they are mounted in the left or right half of the vehicle are formed constructively different, and in which in particular a motor connector connected with the printed circuit board or arranged on the same is to be placed at another point with respect to the housing. By forming two housing openings spatially spaced from each other at a housing for such different types of controller modules, an individual housing thus can be utilized for manufacturing constructively and possibly also functionally different control apparatuses.

In a preferred exemplary embodiment it also is provided that the housing also is designed for different equipment variants of the at least two constructively different types of controller modules. By equipment variant it here is meant that a printed circuit board otherwise unchanged in its geometric dimensions is equipped differently, i.e. provided with different electronic components. In particular in a controller module for controlling a motor vehicle window lifter the individual equipment variants—in particular in dependence on whether the window lifter to be controlled is arranged on the driver side or the passenger side or in the front region of the vehicle interior space or in the rear—can functionally differ from each other. For example, in one equipment variant an anti-squeeze protection can be provided via the controller module of a first or second type, in a further equipment variant only a manual run, or in a third design variant only an automatic run can be provided when opening the window pane. The housing here is dimensioned such that all possible equipments and hence equipment variants of the controller modules of the first or the second type can be accommodated in the housing.

In a preferred exemplary embodiment, at least one housing opening provided at the housing is formed such that through the same a portion of the printed circuit board connected with the connector each can be led out of the housing. In one exemplary embodiment, this portion led out protrudes from a preferably rectangular base portion of the printed circuit board like a pin or finger. For introduction into a housing of the drive unit to be controlled, this portion then can preferably be introduced into a motor housing of the drive unit.

At this preferably finger-like portion led out, there is furthermore preferably arranged at least one sensor element, for example a Hall sensor. This sensor element thus protrudes beyond the portion led out of the printed circuit board in the assembled condition at the housing of a control apparatus. When the housing of the control apparatus is connected with a housing of the drive unit, the sensor element hence can easily be introduced into the housing of the drive unit.

In a preferred exemplary embodiment, a housing opening for a connector formed at the housing furthermore can be closed by a closure element. The closure element serves for preferably sealingly closing that housing opening in which no connector must be held in the used controller module. The closure element thus serves for closing a respectively unused, free housing opening, in order to prevent in particular that via this free housing opening soiling or moisture can get into the interior of the housing. During an assembly of a control apparatus, that housing opening thus can be closed by the provided closure element, which remains free due to the controller module which has been selected from the provided two different types of controller modules.

The closure element preferably is formed as separate component to be attached manually to the housing (in particular to a housing part in the case of a multipart housing). In this way, during assembly of a control apparatus from a provided construction kit of individual components, the assembler each can decide on the basis of the used type of controller module which housing opening is to be closed, and for this purpose the closure element can be used in a simple way. It preferably is provided that one holder each is formed at the housing, in which the closure element can positively be accommodated, in order to close the respective housing opening.

To furthermore avoid having to deliver the closure element separate from a housing, it furthermore is provided in a preferred exemplary embodiment to captively attach the closure element to a part of the housing and to design the same completely removable from this part. In this way, the closure element for closing the respective housing opening can be removed from the housing quickly and easily during assembly of the control apparatus and can be used for closing the housing opening, for example be inserted into a holder of the housing provided for this purpose.

In one exemplary variant, the closure element in a condition as delivered initially is integrally molded to a part of the housing, wherein however the connection between closure element and this part of the housing is formed such that the closure element manually is completely removable from that part of the housing. For example, in a connecting region between the part of the housing and the closure element at least one predetermined breaking point can be incorporated, in order to facilitate the removal of the closure element.

In one exemplary design variant, the interior space of a housing furthermore is dimensioned such that when the printed circuit board of a controller module of the first type is at least partly accommodated in a region inside the housing, an unused free space is left, and when the printed circuit board of a controller module of the second type is at least partly accommodated in the same region, it is arranged in at least one portion of the printed circuit board of the controller module of the second type. The interior space of the housing in which one printed circuit board each of a controller module is to be accommodated at least in part and to be mounted properly, hence is oversized here at least for a printed circuit board of one type of controller module, so that an unused free space is left inside the housing. When arranging the printed circuit board of another type of controller module, on the other hand, the same region is utilized by the differently designed printed circuit board, when the same is properly mounted in the housing.

In one exemplary development, it can be provided that the housing is dimensioned such that in all types of controller modules an unused free space always is left. Thus, the housing actually each is oversized for the individual printed circuit boards of the types of controller modules to be used. The housing thereby in particular allows the accommodation of constructively differently designed printed circuit boards which differ in terms of their geometric shape, their dimensions and/or their respective orientation relative to a component provided in all types of controller modules, which always is to be attached at the same point of the housing.

In one exemplary embodiment, the different types of controller modules each include e.g. a connector for connection of the controller module to a superordinate control system, which always is to be attached to the housing at an identical point. Consequently, the individual controller modules here each include an identical connector, which possibly is provided in addition to a (motor) connector held in a housing opening and is connected with the printed circuit board. In dependence on the type of controller module used (e.g. for a right or a left vehicle side), this motor connector usually will be arranged at a different point. In the two types of controller modules, the connector for connection to a superordinate control system always is identically placed at the housing, but the motor connector for connection to the drive unit to be controlled each must be led out of the housing at a different point.

Preferably, the housing also provides a sufficiently large interior space for a case in which the at least two printed circuit boards to be accommodated selectively in the bare condition each are not formed symmetrically, in particular not point-symmetrically or axially symmetrically.

In one exemplary design variant, the housing includes at least two housing parts connected with each other, which in the connected condition define the interior space of the housing, in which the printed circuit board of the respective controller module is at least partly accommodated. For example, the housing here is composed of two housing halves. These housing halves preferably are connectable with each other manually, in particular via at least one latching connection, in order to be able to assemble the housing of the two housing parts as quickly and easily as possible.

Furthermore, the housing (without a closure element attached thereto or held at the same) preferably is formed symmetrically, in particular mirror-symmetrically to an axis of symmetry. This is advantageous in particular in a housing which is conceived both for a controller module of a first type, which is to be inserted on a first (e.g. the left) vehicle side, and for a controller module of a second type, which is to be inserted on the other (the right) vehicle side. Here, in particular possible housing openings and holding means provided at the housing, via which the housing can be fixed at a drive unit to be controlled, are arranged mirror-symmetrically to an axis of symmetry, so that the housing can easily be used for both vehicle sides with the respective controller module accommodated therein.

Another essential advantage of the present invention is the possibility to provide a construction kit for a control apparatus, in which with a single housing different control apparatuses can be mounted. There is provided a housing of the aforementioned type and a set of at least two controller modules of different types, which each are equipped and provided for connection to a drive unit to be controlled. Since the housing is suitable for both types of controller modules, the same can selectively be combined with the one or other type of control module, in order to mount a control apparatus.

For example in a drive unit of a motor vehicle adjusting device it can depend on its intended mounting location inside a motor vehicle, which controller module is to be selected during assembly and is to be arranged in the provided housing. In such construction kit a housing and two electronic controller modules can be provided, which each are equipped with one of two different printed circuit boards and each can at least partly be accommodated and mounted at the housing. In dependence on whether the control apparatus to be mounted for a drive unit for a window lifter is provided in a left or a right motor vehicle door, the one or the other controller module is selected and combined with the housing.

Preferably, the at least two different types of controller modules are equipped with printed circuit boards which substantially have the same geometric dimensions. The bare printed circuit board of a controller module of a first type thus in particular has substantially the same dimensions as a bare printed circuit board of a controller module of a second type.

In a preferred design variant of a construction kit, the printed circuit boards of the provided controller modules are formed mirror-symmetrical to each other in the bare condition. A preferred design variant in particular can be characterized in that two different printed circuit boards, one of which is formed for a controller module of the first type and the other printed circuit board is formed for a controller module of the second type, are formed mirror-symmetrical to each other in the bare condition. A base surface of the two printed circuit boards definitely can be not point-symmetrical or axially symmetrical itself. Due to the axial symmetry of the two bare printed circuit boards relative to each other, the same have the same geometric dimensions. Thus, for both types of controller modules only one particular basic shape of printed circuit boards is used, to which the housing can easily be adapted, in order to protectively accommodate the two types of controller modules.

A further exemplary aspect of the present invention is the provision of a method for the assembly of a control apparatus, in particular from an aforementioned construction kit, in which from the few components different from each other, such as the at least two different printed circuit boards and otherwise identical components, such as a particular housing, different types of control apparatuses can be mounted. These different types of control apparatuses preferably each are provided for controlling a drive unit of a motor vehicle adjusting device, such as e.g. a window lifter, and constructively differ from each other in that the one control apparatus is provided for the arrangement in a left motor vehicle door and the other control apparatus is provided for the arrangement in a right motor vehicle door.

Such construction kit in addition can be expanded such that it can also be used for mounting control apparatuses for accommodation in a wet space of a (left or right) motor vehicle door. In particular, it was found to be advantageous to use identical printed circuit boards for manufacturing a controller module for a particular side of the motor vehicle, independent of whether the control apparatus to be mounted therewith is to be used for a wet or dry space.

In another, non-inventive method a prefabricated connector unit, which includes at least one connector—preferably for connection of a controller module to a cable of a superordinate control system—and an interface region for electrically connecting the connector with a printed circuit board, is utilized to herewith manufacture controller modules which are suitable either for the combination with a housing of a first type or for the combination with a housing of a second type. The individual types of housing are constructively different from each other such that a controller module which is formed and provided for a housing of a first type cannot properly be accommodated in a housing of a second type.

In connection with such a method the following steps now are provided:
  providing a printed circuit board,
  providing a prefabricated connector unit with a connector and an interface region for electrically connecting the connector with the printed circuit board,
  connecting the printed circuit board with the connector unit for manufacturing the controller module,
and selectively
  fastening the controller module via at least one first fastening region of the prefabricated connector unit to a housing of a first type, which in the assembled condition of the control apparatus at least partly accommodates at least the printed circuit board,
  or
  integrally molding a fastening structure with at least one second fastening region different from the first fastening region to the prefabricated connector unit, and fastening the controller module via this at least one second fastening region to a housing of a second type, which in the assembled condition of the control apparatus at least partly accommodates at least the printed circuit board.

In this method, a prefabricated connector unit, which already includes a fastening region for the proper attachment of the connector unit to a housing of a first type, is used to serve as prefabricated construction unit or basic shape, to which a fastening structure is integrally molded, which is formed and provided for a proper attachment to a housing of a second type.

The connector unit here preferably is utilized as premolded part, to which the fastening structure is integrally molded in an injection molding process.

The connection of the printed circuit board with the connector unit can be effected after integrally molding the fastening structure. It can also be provided that the fastening structure itself is directly connected with the printed circuit board, in order to finish the respective controller module. The printed circuit board preferably is attached to a portion of the fastening structure and to the interface region of the connector unit.

Alternatively or in addition, a further (motor) connector can also be provided at the fastening structure, which is provided for the connection of the controller module to the drive unit to be controlled and is different from the connector of the connector unit.

In one exemplary design variant, the fastening structure furthermore can include a cover by means of which the housing of the second type is—preferably sealingly—closed, when the controller module is attached to the housing. The integrally molded fastening structure thus preferably forms a lid element for the housing of the second type. Via this lid element an insertion opening is closed, via which a controller module which is formed at least by the connector unit, the fastening structure integrally molded thereto, and the printed circuit board at least connected with the connector unit is to be introduced into the housing.

For sealingly closing the housing via the cover of the fastening structure, a sealing element preferably is provided at the fastening structure. In one exemplary embodiment, this sealing element likewise is integrally molded and made of a soft component.

In one exemplary design variant, the housing of the first type is formed and provided for the arrangement in a dry space inside a motor vehicle and the housing of the second type, which is formed constructively different therefrom, is formed and provided for the arrangement in a wet space inside a motor vehicle. Dry space here is understood to be a region, e.g. inside a motor vehicle door, which is largely sealed to the outside, so that in particular no moisture can penetrate into this region from outside the motor vehicle. Wet space, on the other hand, usually is understood to be a region, e.g. inside a motor vehicle door between a door outer skin and an assembly carrier, into which moisture can penetrate from outside the motor vehicle to a significant extent, so that electronic components arranged therein are to be accommodated in a preferably self-sealed housing protecting the same.

The described, but non-inventive method thus likewise solves this object, as different types of control apparatuses likewise can be manufactured thereby in a simple and inexpensive way by means of a construction kit including only few different components. Thus, it can be provided in particular that identical printed circuit boards are provided for a wet space and for a dry space, in case the same are located on the same vehicle long side. The printed circuit boards always are connected with the same connector unit, and a fastening structure merely is or is not integrally molded to this connector unit in dependence on whether the controller module to be manufactured is to be used in a wet space or in a dry space.

BRIEF DESCRIPTION OF THE DRAWINGS

Further features and advantages of the present invention will become apparent from the following description of exemplary embodiments with reference to the Figures.

FIGS. 1A-1C show different perspective views of an exemplary embodiment of a control apparatus in the form of a controller with a housing according to the invention, which can be plugged in at a drive unit.

FIGS. 2A-2C show different perspective views of a prefabricated controller module of a first type, which for the most part is accommodated in the housing of FIGS. 1A-1C.

FIGS. 3A-3B show perspective views of a controller with a housing which is identical to the housing of the controller of FIGS. 1A-1C, but in which a constructively different controller module of a second type is accommodated.

FIGS. 8A-8C show detail representations of the first housing part and the assembled housing for illustrating the closing of a housing opening at the housing by a closure element integrally molded to the first housing part and completely removable from the same.

FIGS. 12C-12D show perspective detail representations of the controller module of FIGS. 12A and 12B without printed circuit board for illustrating the manufacture of this controller module with a connector unit according to FIGS. 5A and 5B.

DETAILED DESCRIPTION

Figure 2C:
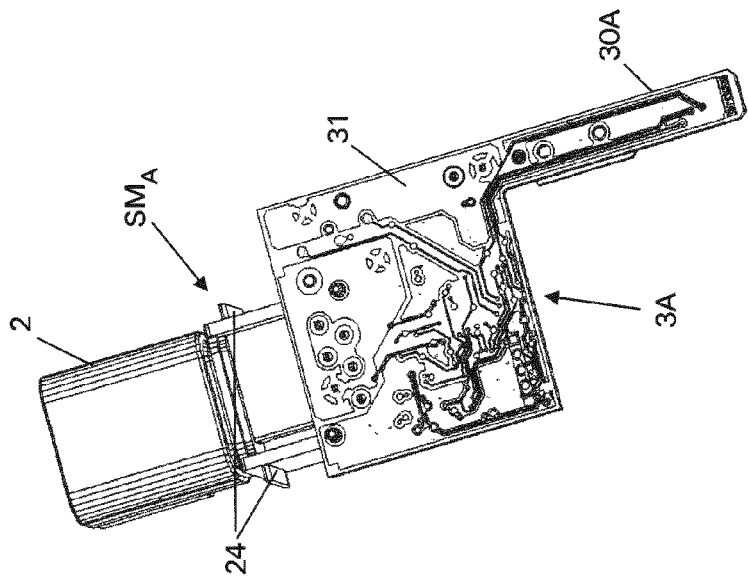
Figure 2B:
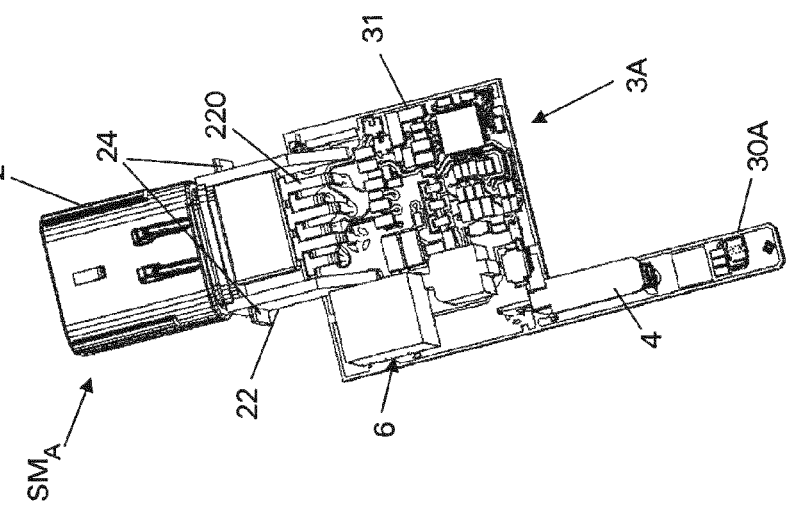
Figure 4A:
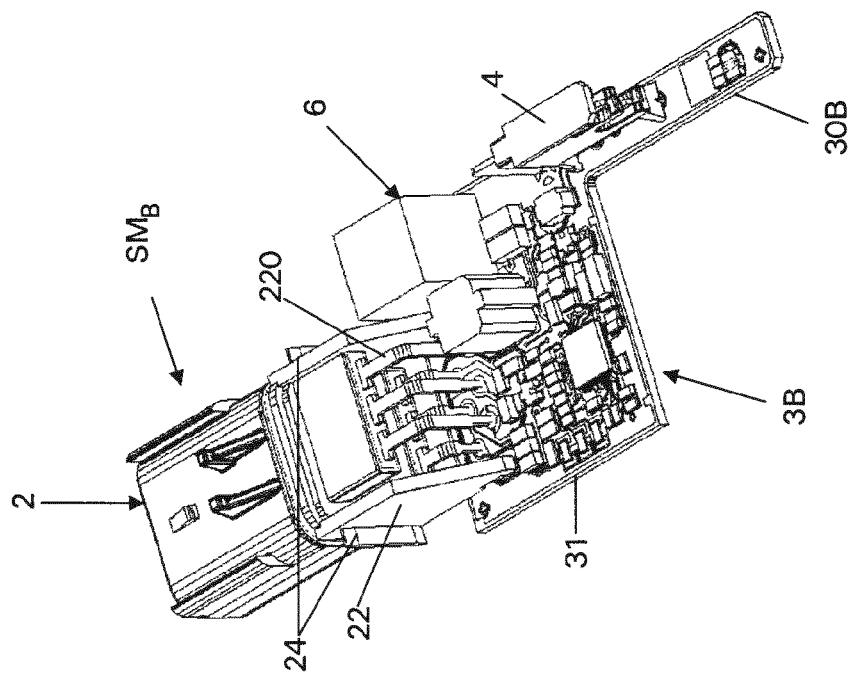
FIGS. 4A-4C show the controller module for the controller of FIGS. 3A and 3B in different perspective views.
Figure 4C:
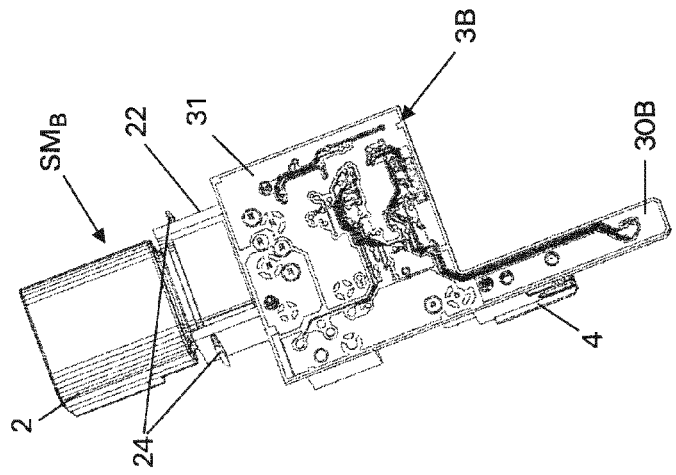
Figure 4B:
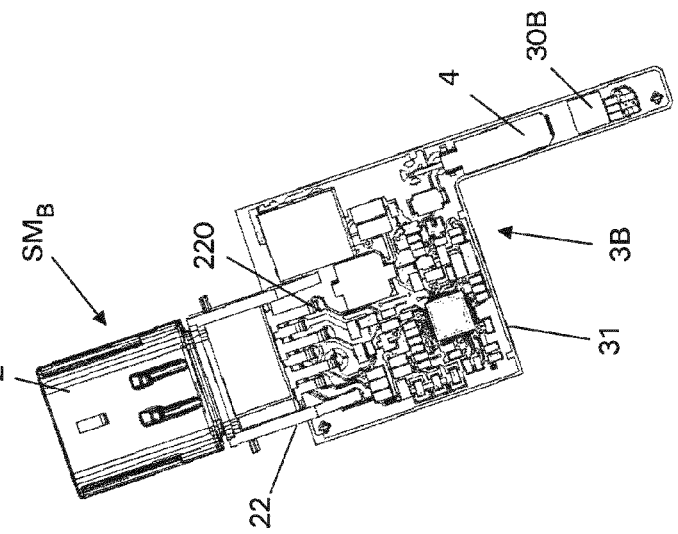

FIGS. 1A and 1B show perspective views of an assembled control apparatus in the form of a controller $SG_A$, which here is equipped and provided for the electronic control of a motorized drive unit for a motor vehicle window lifter. The controller $SG_A$ here includes an exemplary embodiment of a housing 1 according to the invention, in which essential electronic components of the controller $SG_A$ are accommodated. The housing 1 here serves for mounting a controller module $SM_A$, which in FIGS. 2A to 2C is shown in individual views, or of a controller module $SM_B$, which is shown in FIGS. 4A to 4C, and in its interior in particular protectively accommodates essential parts of an equipped printed circuit board 3A, 3B of the respective controller module $SM_A$, $SM_B$.

The housing 1 here is formed of two housing parts 11, 12. These two housing parts 11, 12 each form one half of the housing 1 and define an upper and a lower shell of the housing 1. The two housing parts 11, 12 are fixed at each other via a latching connection. This latching connection here is formed by four tab-like latching hooks in connecting regions 121.1 to 121.4 at the one, second housing part 12 and by latching noses at the other, first housing part 11. Into these latching noses in connecting regions 111.1 to 111.4 (cf. FIG. 6) the elastically pretensioned latching hooks of the second housing part 12 snap in, when the two housing parts 11, 12 are properly pressed against each other.

Figure 11:
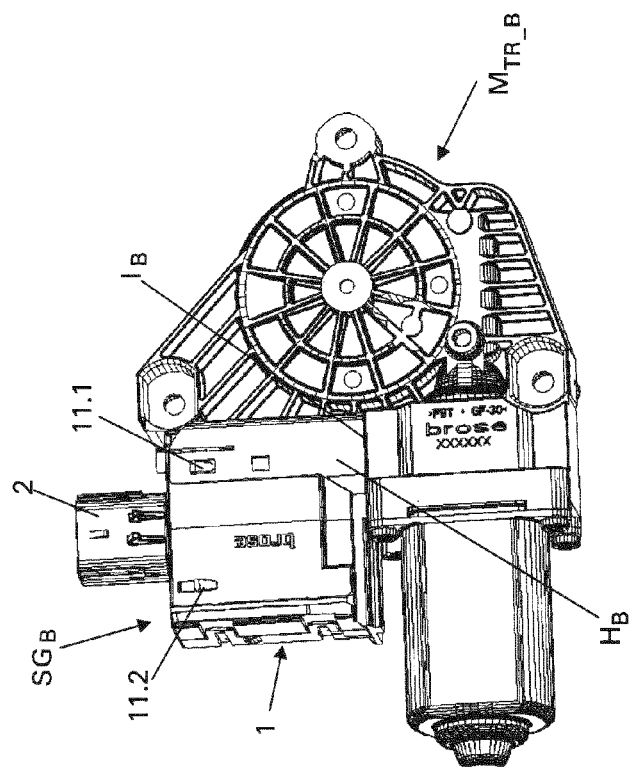
FIG. 11 shows a second drive unit with a controller fixed thereto, which includes a controller module of the second type.
Figure 10:
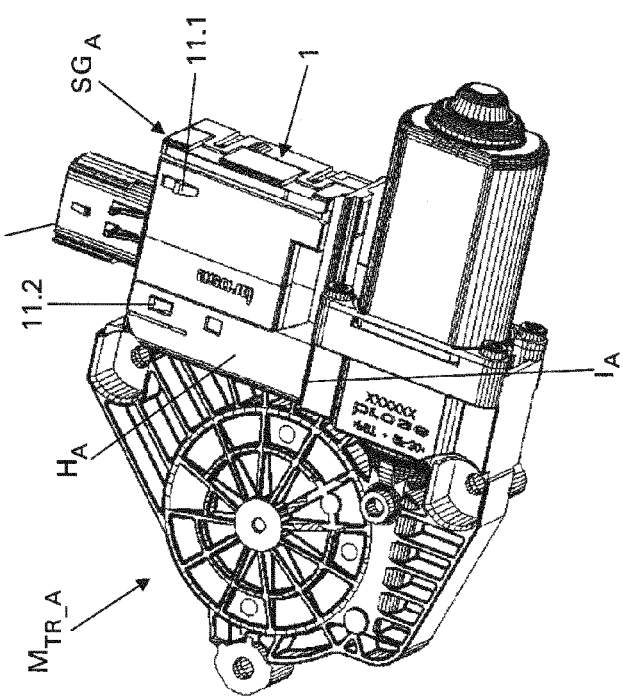
FIG. 10 shows a first drive unit with a controller fixed thereto, which includes a controller module of the first type.

On an outside of the first housing part 11 holding means 11.1 and 11.2 furthermore are formed, which serve the connection of the housing 1 to a motorized drive unit $M_{TR\_A}$ or $M_{TR\_B}$, as they are shown in FIGS. 10 and 11. Via one each of the two holding means 11.1 and 11.2 the housing 1 selectively can be fixed at a holder $H_A$ of the one drive unit $M_{TR\_A}$ or at a holder $H_B$ of the other drive unit $M_{TR\_B}$. For this purpose, the two holding means 11.1 and 11.2 are formed as latching noses, which can positively engage into a corresponding latching opening at the respective holder $H_A$, $H_B$, in order to fix the housing 1 at the respective drive unit $M_{TR\_A}$, $M_{TR\_B}$.

A holder $H_A$, $H_B$ each is formed by a rail-like portion U-shaped in cross-section at the housing of the respective motorized drive unit $M_{TR\_A}$, $M_{TR\_B}$. To be able to more easily introduce the assembled housing 1 into the respective holder $H_A$, $H_B$, the housing includes two slideways 11.3, 11.4 located opposite each other in parallel. One slideway 11.3, 11.4 each here is associated to one of the two holding means 11.1, 11.3. Into a slideway 11.3, 11.4 a protruding pin (or web) of the holder $H_A$, $H_B$ can engage, so that the housing 1 is guided along this protruding pin (or web), until the housing 1 reaches a proper end position in which the respective holding means 11.1, 11.2 locks into place with the holder $H_A$ or $H_B$.

The housing 1 here is formed mirror-symmetrical to a longitudinal axis. It is formed and provided to selectively hold one of the two different controller modules $SM_A$, $SM_B$ and in particular at least partly each accommodate their equipped printed circuit board 3A, 3B in its interior. For both types of controller modules $SM_A$, $SM_B$ the housing 1 includes a cutout 100 in which a connector of a connector unit 2 is positively held, so that a connection cable can be connected to this connector from outside the housing 1. The connector unit 2 here defines a built-in plug, to which a superordinate control system can be connected. For fixing a connecting plug at the plug housing 20, the same includes additional holding means 21. These holding means 21 likewise formed as protruding latching noses lock into place with the corresponding connecting plug, when the same is properly connected with the connector of the connector unit 2, in order to prevent an inadvertent separation of the plug connection.

On a side of the housing 1 diametrically opposite the connector unit 2, the housing 1 includes two housing openings 101, 102 formed symmetrical to each other. These are each provided for holding a motor connector 4, which is part of the respective controller module $SM_A$, $SM_B$ corresponding to FIG. 2A to 2C or 4A to 4C. Thus, the respective motor connector 4 is held in one of the housing openings 101, 102.

Holding in the respective housing opening 101, 102 each is effected such that the motor connector 4 for connecting the respective assembled controller $SG_A$ (corresponding to FIG. 1A to 1B) or $SG_B$ (corresponding to FIG. 3A) to the respective drive unit $M_{TR\_A}$, $M_{TR\_B}$ is accessible from outside the housing 1. The motor connector 4 thus each protruding at the housing easily can be plugged into a corresponding connector, e.g. a socket, at the housing of the respective drive unit $M_{TR\_A}$, $M_{TR\_B}$. Both in a controller module $SM_A$ of the first type corresponding to FIGS. 2A to 2C and in a controller module $SM_B$ of a second type corresponding to FIGS. 4A to 4C the motor connector 4 here is mounted directly on the component side of an associated printed circuit board 3A, 3B.

The motor connector 4 each is present on a circuit board portion 30A or 30B which each protrudes like a finger from a rectangular base portion 31 of the respective printed circuit board 3A, 3B. In the assembled condition of the respective controller $SG_A$, $SG_B$ this finger-like circuit board portion 30A, 30B is led out through the respectively associated housing opening 101 or 102 of the housing 1, when the controller module $SM_A$ or $SM_B$ is properly mounted on the housing 1. The finger-like conductor portion 30A, 30B here furthermore carries at least one Hall sensor and is provided for introduction into the interior of the housing of the respective drive unit $M_{TR\_A}$, $M_{TR\_B}$.

By providing two housing openings 101, 102 at the housing 1 and by dimensioning the housing 1 such that it can protectively accommodate differently formed printed circuit boards 3A, 3B in its interior, the present housing 1 is usable for different controller modules $SM_A$, $SM_B$, which due to being mounted on different long sides of a motor vehicle (to the left or right) are constructively different from each other. In particular electronic components 6, with which the respective printed circuit board 3A, 3B is equipped, each are arranged differently with respect to the connector unit 2 and also the respectively provided finger-like protruding circuit board portion 30A, 30B must be accommodated at another point of the housing 1 and be led out of the same. Despite these constructive differences, however, the housing 1 can be combined with both controller modules $SM_A$, $SM_B$, in order to mount a controller $SG_A$ or $SG_B$.

In its interior, the housing 1 therefore is dimensioned such that during the accommodation of the printed circuit board 3A of the controller module $SM_A$ of the first type, which is provided e.g. for the left motor vehicle side, an unused free space $F_A$ is left inside the housing 1. This free space $F_A$ is shown in the representation A of FIG. 1C, in which the housing 1 is illustrated in a still unclosed condition. In this unclosed condition, the controller module $SM_A$ already is inserted into the second, lower housing part 12, but the housing is not yet closed by the first, upper housing part 11. The region in which the free space $F_A$ remains unused during the accommodation of the printed circuit board 3A of the one controller module $SM_A$, correspondingly is completely occupied by the printed circuit board 3B of the other controller module $SM_B$ during accommodation of the same, as is shown in FIG. 3B. Here, a free space $F_B$ remains inside the housing in a region which is located opposite the region with the free space $F_A$. An interior space 10 of the housing 1, in which a printed circuit board 3A, 3B of a controller module $SM_A$, $SM_B$ properly is at least partly accommodated and mounted, thus is oversized for each of the printed circuit boards 3A, 3B, so that always an unused free space $F_A$, $F_B$ is left in the interior space 10. In this way, the housing 1 provides regions in its interior which can only be utilized by one of the two controller modules $SM_A$, $SM_B$ to be accommodated. Thus, it has dimensions in its interior which are suitable for both constructively differently designed printed circuit boards 3A, 3B.

The printed circuit boards 3A, 3B which are utilized for forming the two different controller modules $SM_A$, $SM_B$, here are formed symmetrical to each other in the bare condition, i.e. each without components 6, connector unit 2 and motor connector 4. Two bare printed circuit boards 3A and 3B arranged one beside the other consequently would be mirror-symmetrical to an axis of symmetry extending between the same. Due to the symmetric formation of the two different printed circuit boards 3A, 3B, which selectively can be arranged in the housing 1, the housing 1 can be formed symmetrical and nevertheless is comparatively compact, although it is adapted in its dimensions to both controller modules $SM_A$, $SM_B$.

In the illustrated design variant, the different types of controller modules $SM_A$, $SM_B$ and controllers $SG_A$, $SG_B$ are manufactured by means of a construction kit from which the components to be connected with each other are selected. Here, there are merely provided different printed circuit boards 3A, 3B, in particular equipped with a motor connector 4, for the different controller modules $SM_A$, $SM_B$. During the manufacture, the respective printed circuit board 3A, 3B is connected with a connector unit 2, which is identical for both types of controller modules $SM_A$, $SM_B$. Subsequently, the controller module $SM_A$, $SM_B$ thus formed is arranged in one of the housing parts 11, 12 of the housing 1 of the construction kit. Consequently, for both controllers $SG_A$, $SG_B$ some identical components of the construction kit are used, such as the connector unit 2 and the two housing parts 11, 12, which are shown in FIGS. 5A-5B, 6 and 7 in individual representations.

Figure 5B:
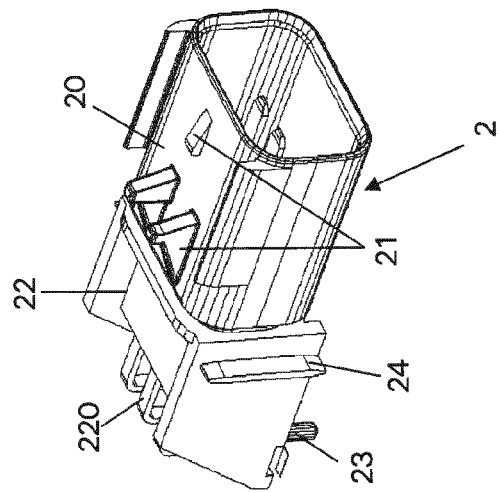
FIGS. 5A-5B show perspective views of a connector unit, which is inserted both in the controller module of the first type and in the controller module of the second type.
Figure 5A:
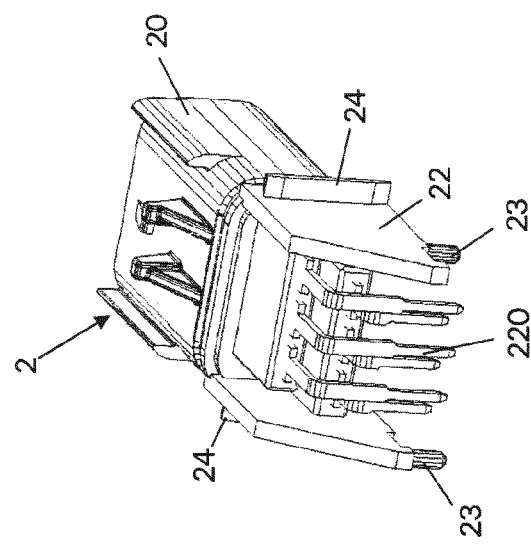

The connector unit 2 according to FIGS. 5A-5B includes an interface region 22 formed at the plug housing 20, via which the connector unit 2 and the respective printed circuit board 3A, 3B can electrically be connected with each other. At the interface region 22 a plurality of conductor pins 220 therefore are provided, which can be connected with conductor paths on the printed circuit board 3A or 3B. Furthermore, the interface region 22 includes fastening pins 23, via which the prefabricated connector unit 2 can be plugged onto the printed circuit board 3A or 3B.

At the connector unit 2 two fastening regions in the form of two narrow webs 24 are formed in addition. In the assembled condition of a controller module $SM_A$, $SM_B$ these webs 24 serve the attachment of the respective controller module $SM_A$, $SM_B$ to a holder 124 of the housing 1 provided for this purpose. The holder 124 is provided by at least two gripping portions. Each of these gripping portions includes a gap into which an associated web 24 of the connector unit 2 can be introduced, so that the respective web 24 is positively held therein. Both types of controller modules $SM_A$, $SM_B$ thus can be fixed in the housing 1 via fastening regions 24 provided at the prefabricated connector unit 2. This is clearly shown in particular in the representations of FIGS. 10 and 3B, in each of which a controller module $SM_A$, $SM_B$ inserted into the second housing part 12 is shown.

In FIGS. 5A-5B, 6 and 7 the components of a provided construction kit are shown in detail, which are identical for all controllers $SG_A$ and $SG_B$ usable in a dry space: the connector unit 2, the first housing part 11 or the upper shell of the housing 1, and the second housing part 12 or the lower shell of the housing 1. In connection with two corresponding, different types of printed circuit boards 3A, 3B different types of controllers $SG_A$, $SG_B$ can be manufactured from these components, which are equipped and provided either for controlling a drive unit $M_{TR\_A}$, $M_{TR\_B}$ on the one (e.g. left) vehicle side or on the other (right) vehicle side.

Figure 6:
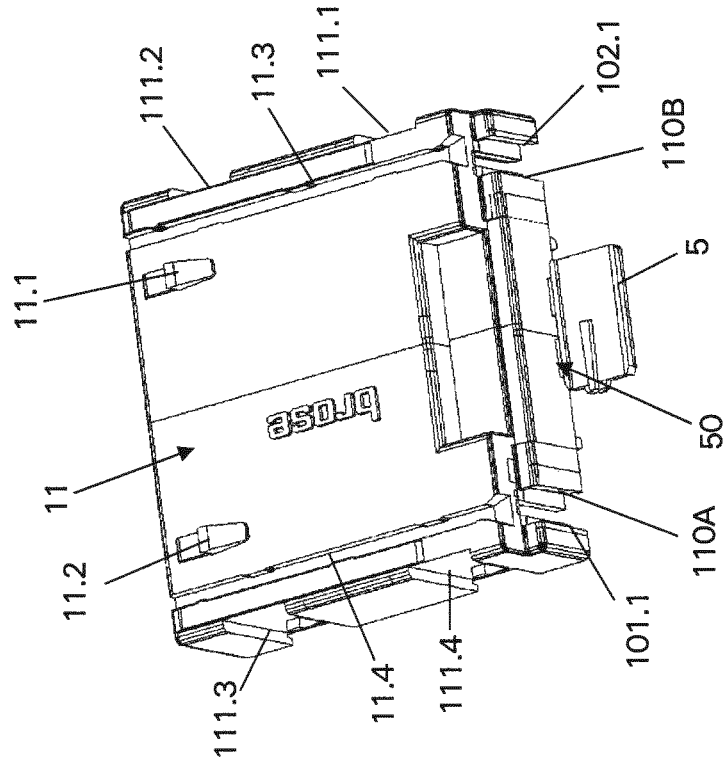
FIG. 6 shows a perspective view of a first housing part of the two-part housing of the preceding FIGS.

In the individual view of the first housing part 11 in FIG. 6 in particular the above-mentioned connecting regions 111.1 to 111.4 provided with latching noses also are shown in detail, into which the tab-like latching hooks of the second housing part 12 engage, in order to fix the two housing parts 11, 12 at each other.

Figure 7:
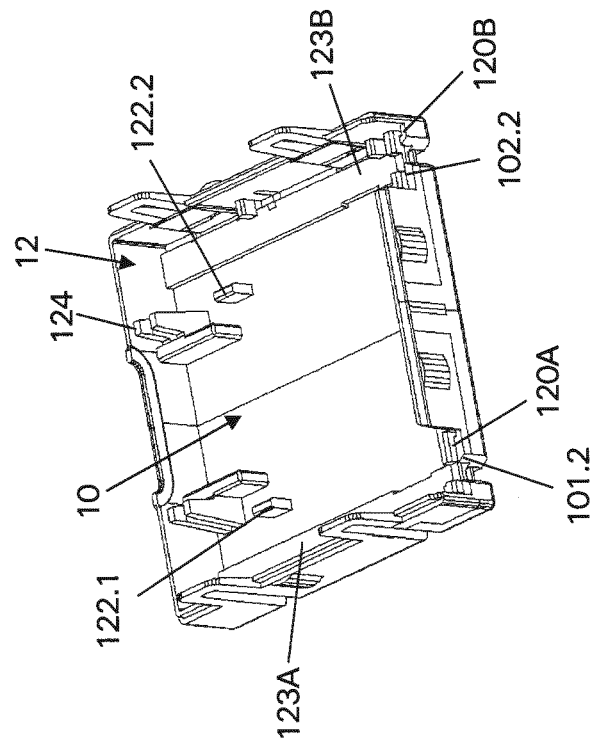
FIG. 7 shows a perspective view of a second housing part.

FIG. 7 shows the second housing part 12 without a printed circuit board 3A, 3B accommodated therein. Support portions 122.1 and 122.2 in the form of webs, which protrude into the interior space 10, thereby are shown, on which the respective printed circuit board 3A or 3B can rest properly.

Inside the housing part 12 opposed edge-side support portions 123A and 123B furthermore are provided, which here appear longitudinally extended and rectangular. In the assembled condition of the housing 1, an edge-side support portion 123A adjoins the one (left) housing opening 101 and extends away from the same into the interior of the housing 1. Accordingly, the other support portion 123B adjoins the other (right) housing opening 102 and extends away from the same into the interior of the housing 1. These edge-side support portions 123A, 123B each serve only one of the printed circuit boards 3A, 3B as support surface and possibly are left as unused free space $F_A$, $F_B$. The support portions 123A, 123B thus each provide only one support surface for one of the two printed circuit boards 3A, 3B for the controller modules $SM_A$, $SM_B$ to be installed selectively, on which the printed circuit board 3A, 3B of the respective controller module $SM_A$, $SM_B$ supports.

Since by inserting the desired controller module $SM_A$, $SM_B$ one of the two provided housing openings 101, 102 remains unused and thus soiling or moisture possibly can get into the interior of the housing 1 through this housing opening 101, 102, it is provided in the illustrated design variant to close a respectively unused housing opening 101, 102 by a closure element 5. The closure element 5 here is a plate-shaped or disk-shaped component, which is manually insertable into a holder of the housing 1. This holder, in which the closure element 5 is to be held in a positive way, here is formed by a pair of holder portions 110A, 120A for the one (left) housing opening 101 and by a pair of holder portions 110B, 120B for the other (right) housing opening 102.

In a pair of holder portions 110A and 120A or 110B and 120B associated to each other, one each is formed at the first housing part 11 and the other one is formed at the second housing part 12. The holder portions 110A, 110B or 120A, 120B each are formed in the region of a U-shaped cutout 101.1, 102.1 or 101.2, 102.2 in a side wall of the respective housing part 11, 12. Two cutouts 101.1, 101.2 or 102.1, 102.2 together each form one of the two housing openings 101, 102 at the assembled housing 1. In the region of each of these cutouts 101.1, 101.2, 102.1, 102.2 a side wall of the respective housing part 11, 12 is provided with slots, so that the closure element 5 can be plugged in there and be held there.

In a condition as delivered, the closure element 5 is arranged at the second housing part 11, preferably integrally molded to the same. During assembly of a controller $SG_A$, $SG_B$ the closure element 5 is completely removed from the housing part 11 and in dependence on the type of the controller module $SM_A$ or $SM_B$ manufactured from the provided construction kit is plugged into the one holder portion 110A or into the other holder portion 110B of the housing part 11, in order to (sealingly) close the one housing opening 101 or the other housing opening 102 in the assembled condition of the housing 1.

These assembly steps are illustrated in FIGS. 8A to 8C. The closure element 5 initially is integrally molded to an outside of the housing part 11 via a connecting region with at least one predetermined breaking point 50 and completely is manually removed from the housing part 11 by an assembler. The closure element 5 separated from the housing part 11 then either is plugged into the one holder portion 110A when a controller module $SM_B$ of the second type is to be placed in the housing 1 to be assembled (case (A) of FIG. 8A). Alternatively, the closure element 5 separated from the housing part 11 is inserted into the other holder portion 110B when a controller module $SM_A$ of the first type is to be placed in the housing 1 to be assembled (case (B) of FIG. 8A). The closure element 5 inserted in the respective holder portion 110A, 110B still protrudes—here approximately half of it—from the holder portion 110A, 110B. When connecting the two housing parts 11, 12, the portion of the inserted closure element 5 thus protruding from the first housing part 11 is introduced into the respective associated holder portion 120A or 120B at the other, second housing part 12. After connecting the two housing parts 11, 12, the unused housing opening 101 or 102 thereby is closed by the closure element 5.

Of course, it is also possible to first insert the closure element 5 at the second housing part 12, in which also before connection with the first, upper housing part 11 the controller module $SM_A$ or $SM_B$ is arranged, and to have the closure element 5 engage into the first housing part 11 only during connection of the two housing parts 11, 12.

In an alternative design variant it can be provided in addition that only after the connection of the two housing parts 11, 12 the closure element is plugged into the holder formed by two holder portions 110A and 120A or 110B and 120B for closing the unused housing opening 101 or 102. The design variant proposed in the Figures in so far is preferred, as this does not allow a removal of the closure element 5 without separating the two housing parts 11, 12 from each other.

Figure 9B:
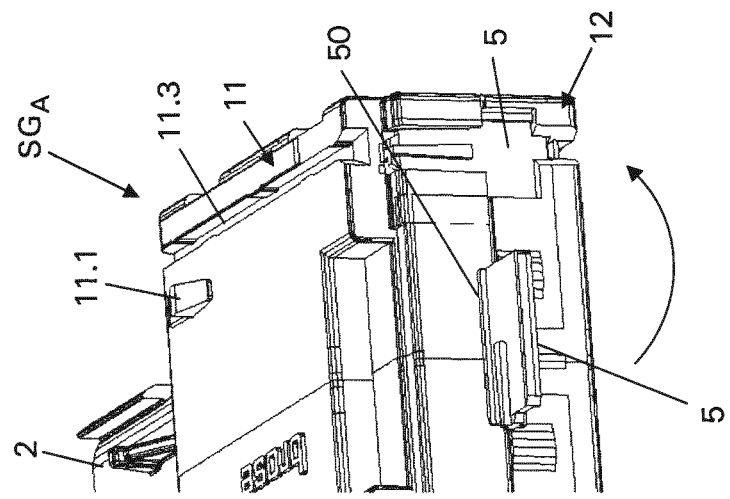
FIGS. 9A-9B show two perspective views of the housing with a housing opening each closed by the closure element.
Figure 9A:
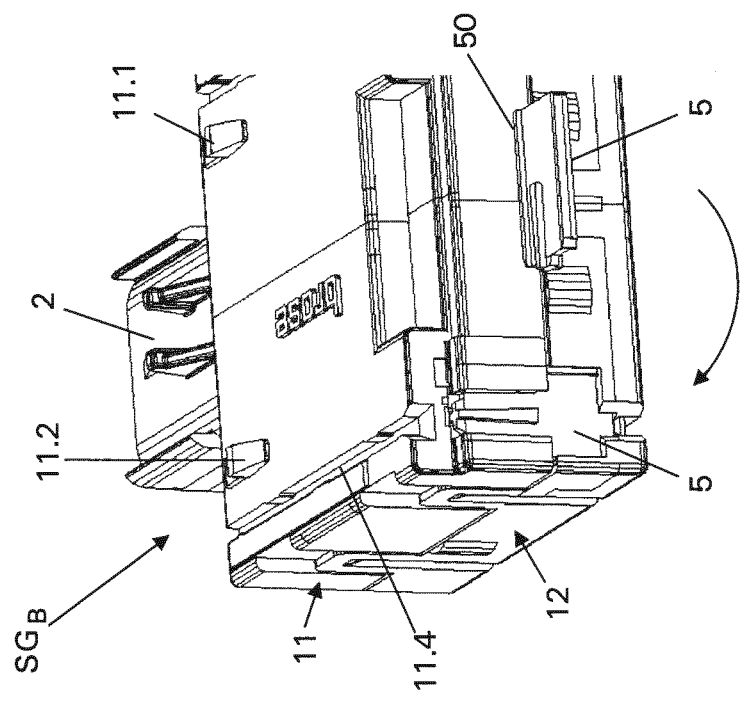

The possible, different configurations of the housing 1 with the closure element 5 additionally are illustrated with FIGS. 9A and 9B. FIG. 9A partly shows a controller $SG_B$ with a (left) housing opening 101 closed by the closure element 5. FIG. 9B in turn shows a controller $SG_A$ with a (right) housing opening 102 closed by the closure element 5.

In FIGS. 10 and 11, to which reference already has been made above, the two different drive units $M_{TR\_A}$ and $M_{TR\_B}$ are shown, which each are formed for driving a window lifter on a dry space side of a motor vehicle door and for this purpose include an electric motor which is to be controlled via a controller $SG_A$ and $SG_B$, respectively. Due to the symmetric design of the housing 1, the same can be mounted and fixed both at a holder $H_A$ of the one drive unit $M_{TR\_A}$ and at a holder $H_B$ of the other drive unit $M_{TR\_B}$.

Merely in dependence on the controller module $SM_A$ or $SM_B$ placed in the housing 1, the motor connector 4 and the finger-like circuit board portion 30A, 30B protrudes from the one housing opening 101 or from the other housing opening 102 at the housing 1. In a connecting region $I_A$, $I_B$ of the respective drive unit $M_{TR\_A}$, $M_{TR\_B}$ an electric connection to the drive motor is created via the motor connector 4, and the finger-like circuit board portion 30A, 30B equipped with a Hall sensor is introduced into the motor housing of the drive unit $M_{TR\_A}$ and $M_{TR\_B}$, respectively.

While the two drive units $M_{TR\_A}$ and $M_{TR\_B}$, shown in FIGS. 10 and 11 merely differ by the side of a motor vehicle, on which they must be accommodated in a dry space, and thus an identical housing 1 can be fixed at both drive units $M_{TR\_A}$, $M_{TR\_B}$ a housing for a drive unit for a wet space inside the motor vehicle regularly must be formed in a constructively different way. The drive units $M_{TR\_A}$ and $M_{TR\_B}$ of FIGS. 10 and 11 thus represent a first type of drive units which can be combined with a housing 1 of a first type.

Figure 13B:
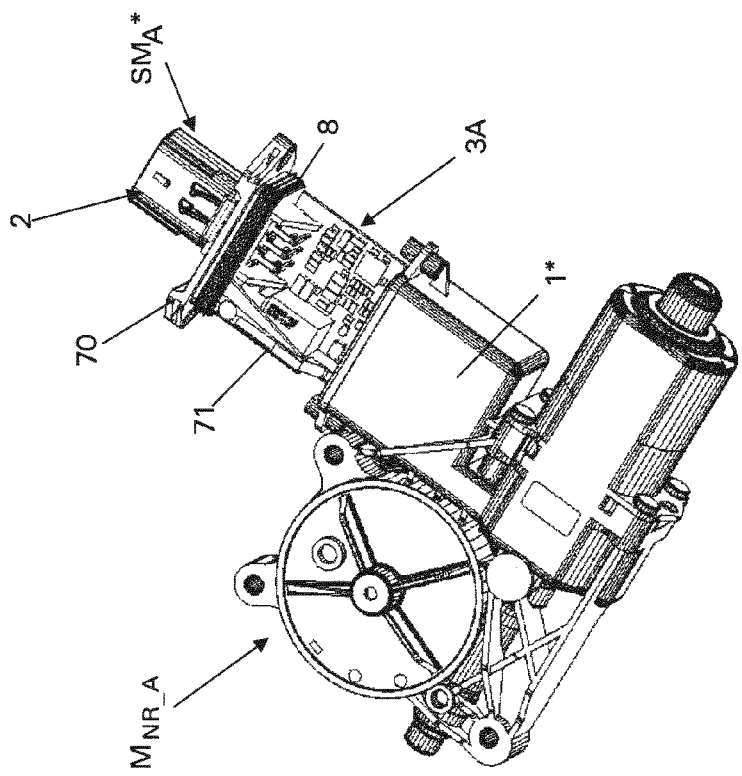
FIGS. 13A-13B show a further drive unit with a housing of the second type, into which the controller module according to FIGS. 12A to 12D is inserted.
Figure 13A:
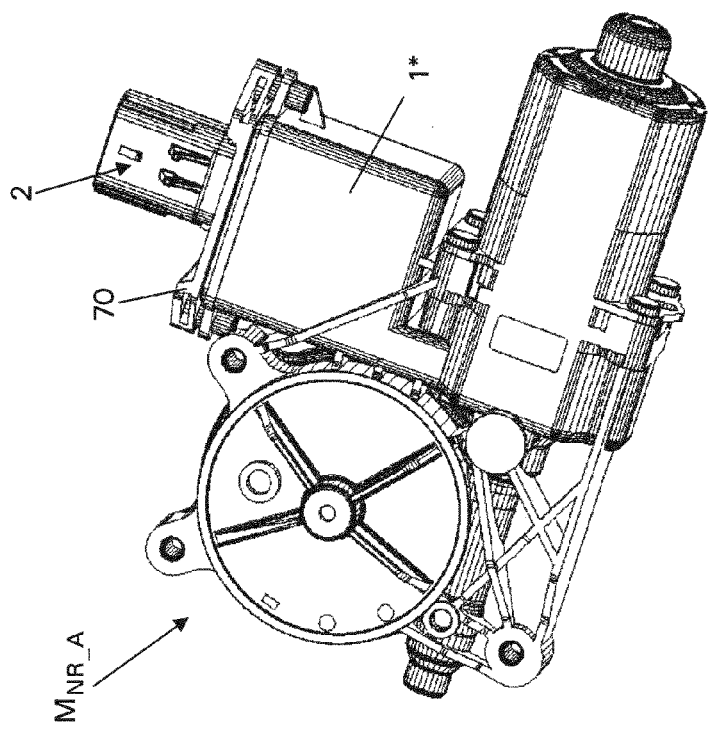

On the other hand, for the accommodation in a wet space a drive unit $M_{NR\_A}$ (for a left vehicle side) of a second type can be used, as it is shown in FIGS. 13A and 13B by way of example. This drive unit $M_{NR\_A}$ is combined with a housing 1* of a second type, in which the electronic components 6 arranged on a printed circuit board 3A can be accommodated with a better protection against the ingress of moisture. For this purpose, the housing 1* includes an insertion opening via which a controller module $SM_A$* can be introduced into the housing 1* mounted already and which can sealingly be closed. In the present case, a housing 1* of a second type thus constructively differs from a housing 1 corresponding to the Figures explained above in that such housing 1* of a second type includes a lid element sealingly closing the housing 1*, which closes the housing 1* when the corresponding controller module $SM_A$* has been placed therein.

So far, it has been known for example to use different printed circuit boards for controller modules for a dry space on the one hand and for controller modules for a wet space on the other hand. In the present design variant on the other hand, merely two types of printed circuit boards 3A and 3B for the different vehicle long sides (right or left) are provided in one construction kit—possibly in functionally different equipment variants, without however deviating from the basic geometric shape of the printed circuit board 3A, 3B or preferably from the respective circuit board layout. In addition, the printed circuit boards 3A, 3B also always are connected with an identical provided connector unit 2. For the assembly of a control apparatus, it only is distinguished whether the controller module to be manufactured ultimately is to be placed in a housing 1 of a first type or in a housing 1* of a second type.

During the assembly, the prefabricated connector unit 2, which is shown in FIGS. 5A and 5B by way of example, now selectively is connected only with the printed circuit board 3A, in order to provide a controller module $SM_A$ for a particular side of the motor vehicle and for a housing 1 to be arranged in a dry space, or the connector unit 2 is used as prefabricated component, to which an additional fastening structure 7 is integrally molded and which subsequently is connected with the printed circuit board 3A, in order to provide a controller module $SM_A$*, which is suitable for the same side of the motor vehicle, but for a housing 1* to be arranged in a wet space. The connector unit 2 thus is expanded by the fastening structure 7, if necessary, in order to manufacture an alternative controller module $SM_A$* of the same type (i.e. for the same motor vehicle side), but for a constructively different housing 1* for the wet space.

Figure 12A:
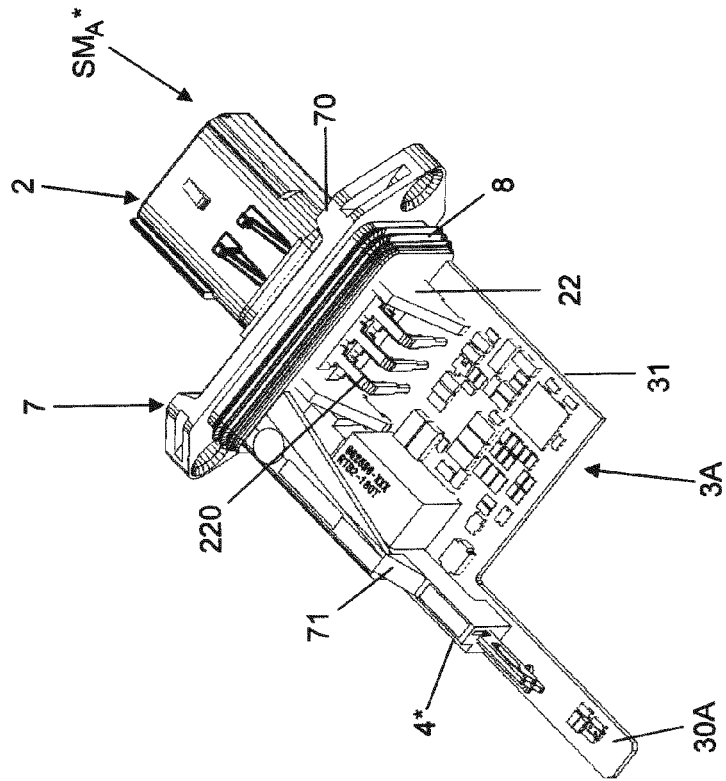
FIGS. 12A-12B show perspective views of a further controller module which is insertable into a housing of a second type, which constructively differs from the housing of the preceding FIGS.
Figure 12B:
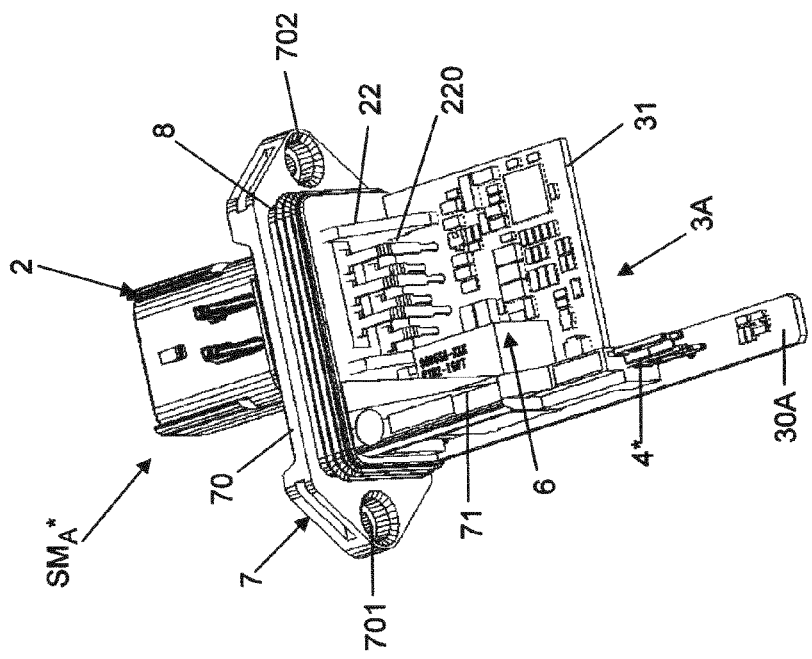

In FIGS. 12A and 12B such alternative controller module $SM_A$* is illustrated. In the same, the prefabricated connector unit 2 serves as pre-molded part to which the fastening structure 7 is integrally molded during an injection molding process. The fastening structure 7 here among other things forms a cover 70, via which the housing 1* can be closed corresponding to FIGS. 13A and 13B. Furthermore, a sealing element 8 of a soft component is integrally molded to this cover 70. This sealing element 8 ensures that with the cover 70 the housing 1* is sealingly closed against a surrounding exterior space.

Furthermore, two additional fastening regions in the form of through openings 701 and 702 are formed at the fastening structure 7. These through openings 701, 702 serve the fixation of the controller module $SM_A$* inserted in the housing 1* at the housing 1*. Thus, for example additional fastening elements such as screws can engage the through openings 701, 702, in order to sealingly fix the cover 70 at the housing 1*.

As is shown in particular in the individual views of FIGS. 12C and 12D, the integrally molded fastening structure 7 forms a carrier portion 71, which is connected with the printed circuit board 3A subsequent to integrally molding the fastening structure 7. In addition, in the present exemplary embodiment a motor connector 4* also already is provided at the carrier portion 71. The conductors serving the electric connection of the motor connector 4* with the printed circuit board 3A accordingly already are embedded in the carrier portion 71.

In summary, the fastening structure 7 with its cover 70, the sealing element 8 and the carrier portion 71, here initially is integrally molded to the connector unit 2 serving as premolded part. Subsequently, the connection of the connector unit 2 and the fastening structure 7 with the printed circuit board 3A then is effected. The controller module $SM_A$* manufactured in this way then can be inserted into the housing 1* via an insertion opening. The cover 70 of the controller module $SM_A$* completely closes this insertion opening, when the controller module $SM_A$* is properly arranged at the housing 1*.

In the present case the housing 1* also is molded at the drive unit $M_{NR\_A}$, so that the finger-like protruding circuit board portion 30A and the motor connector 4* automatically are properly introduced into the drive unit $M_{NR\_A}$ or electrically connected with the same, when the controller module $SM_A$* is inserted into the housing 1*.

In a construction kit which serves both for the assembly of a control apparatus for a drive unit $M_{TR\_A}$, $M_{TR\_B}$ to be inserted in a dry space and for the assembly of a control apparatus for a drive unit $M_{NR\_A}$ to be inserted in a wet space, as many identical components as possible thus are provided, such as the prefabricated connector unit 2, printed circuit boards 3A and 3B (with possibly merely different equipment, but otherwise identical layout for the arrangement on the same motor vehicle sides), and merely two different housings 1, 1*. As a result, only a small number of different prefabricated components thus must be provided, so that in the manufacturing process different controller modules $SM_A$, $SM_B$, $SM_A$* and control apparatuses $SG_A$, $SG_B$ formed therewith can be manufactured, which each are equipped and provided for controlling a drive unit $M_{TR\_A}$, $M_{TR\_B}$, $M_{NR\_A}$ and differ with regard to whether they are to be arranged in the wet space or in the dry space of a motor vehicle and on a left or right motor vehicle side. Tooling, validation and automation costs thereby can be reduced enormously.

It can of course also be provided that a housing 1* for a wet space likewise is designed analogously to the housing 1 for the dry space, so that it can accommodate controller modules of different types, i.e. for different sides of the motor vehicle.

The invention claimed is:

1. A housing for an electronic controller module for controlling a drive unit of a motor vehicle adjusting device, wherein the controller module is configured to be connected to the drive unit to be controlled and for controlling the drive unit comprises at least one printed circuit board, and wherein the housing is configured to at least partly accommodate the printed circuit board of the controller module, wherein the housing is configured to selectively at least partly accommodate the printed circuit board of one of at least two different types of controller modules with different printed circuit boards, and wherein a first type of controller module is configured to control a drive unit on a first side of a motor vehicle, and a second type of controller module is configured to control a drive unit on a second side of the motor vehicle, which is located opposite the first side transversely to a longitudinal vehicle axis, and wherein the housing includes a first and a second housing opening, wherein a connector configured to connect the controller module to the drive unit to be controlled may be accommodated, depending on the type of controller module, either in the first or the second housing opening such that the connector is accessible from outside the housing, and the first and second housing openings are formed such that a portion of the printed circuit board connected with the connector can extend from the housing through the first or second housing opening in which the connector is accommodated.

2. The housing according to claim 1, wherein the first and the second housing openings are configured to be closed by a closure element.

3. The housing according to claim 2, wherein the closure element can be positively accommodated in a holder formed at the housing in order to close the respective housing opening.

4. The housing according to claim 2, wherein the closure element is releasably attached to a part of the housing and can completely be removed from that part of the housing in order to be used for closing the respective housing opening.

5. The housing according to claim 1, wherein an interior space of the housing is dimensioned such that during the at least partial accommodation of the printed circuit board of a controller module of the first type in a region inside the housing an unused free space is left and during the at least partial accommodation of the printed circuit board of a controller module of the second type in the region inside the housing at least one portion of the printed circuit board of the controller module of the second type completely occupies the region.

6. The housing according to claim 1, wherein the housing includes at least two housing parts connected with each other to define an interior space of the housing in which the printed circuit board of a controller module is at least partly accommodated.

7. The housing according to claim 1, wherein the housing is formed symmetrically, in particular mirror-symmetrically to an axis of symmetry.

8. A construction kit for a control apparatus, the construction kit comprising a housing according to claim 1 and comprising at least two different electronic controller modules of a first and a second type, each controller module being configured for connection to the drive unit to be controlled and for controlling the drive unit, wherein for the assembly of a control apparatus, a controller module of the first or the second type can be used selectively, and wherein the housing is configured to selectively at least partly accommodate the printed circuit board of the first or the second type of controller module, wherein the printed circuit boards each include a protruding portion and wherein the housing openings are formed such that, in the assembled condition of the control apparatus, the protruding portion of a printed circuit board connected with the connector is guided through one of the housing openings to extend from the housing.

9. The construction kit according to claim 8, wherein the at least two different types of controller modules each include printed circuit boards which substantially have the same geometric dimensions.

10. The construction kit according to claim 8, wherein the construction kit includes a prefabricated connector unit with a connector and an interface region for electrically connecting the connector with a printed circuit board, and wherein the connector unit can be used both for manufacturing the controller module of the first type and for manufacturing the controller module of the second type.

11. The construction kit according to claim 8, wherein at the extending portion at least one sensor element, in particular a Hall sensor is arranged.

12. The housing according to claim 1, wherein the drive unit is a drive unit of a window lifter.

13. A housing for an electronic controller module, wherein the controller module comprises a printed circuit board and at least one connector for connection of the controller module to a drive unit to be controlled, and wherein the housing is configured to at least partly accommodate the printed circuit board of the controller module and includes at least one housing opening for the connector, in which the connector of the controller module can be held such that the connector for connection to the drive unit is accessible from outside the housing, and wherein the housing includes at least two housing openings and the housing is configured to selectively at least partly accommodate at least the printed circuit board and the at least one connector of one of at least two different types of controller modules such that the connector of a first type of controller module is held in one of the housing openings and the connector of the second type of controller module is held in another of the housing openings, in each case a portion of the printed circuit board connected with the connector extending from the housing through the respective housing opening.

14. A construction kit for a control apparatus, the construction kit comprising a housing for an electronic controller module for controlling a drive unit of a motor vehicle adjusting device, wherein
 the controller module is configured for connection to the drive unit to be controlled and for controlling the drive unit comprises at least one printed circuit board, and
 the housing is configured to at least partly accommodate the printed circuit board of the controller module, wherein the housing is configured to selectively at least partly accommodate the printed circuit board of one of at least two different types of controller modules with different printed circuit boards, and
 a first type of controller module is configured for controlling a drive unit on a first side of a motor vehicle, and a second type of controller module is configured for controlling a drive unit on a second side of the motor vehicle which is located opposite the first side transversely to a longitudinal vehicle axis,
wherein the construction kit comprises at least two different electronic controller modules of a first and a second type which are each configured for connection to the drive unit to be controlled and for controlling the drive unit wherein
for the assembly of a control apparatus, a controller module of the first or the second type can be used selectively, and
the housing is configured to selectively at least partly accommodate the printed circuit board of the first or the second type of controller module,
the at least two different types of controller modules include respective printed circuit boards which substantially have the same geometric dimensions and,
in the bare condition, the printed circuit boards of the controller modules are formed symmetrical to each other.

15. The construction kit according to claim 14, wherein the printed circuit boards form a mirror image of each other along an axis of symmetry extending between two printed circuit boards adjacent to each other.

* * * * *